United States Patent [19]
Lehrmann et al.

[11] Patent Number: 5,712,765
[45] Date of Patent: Jan. 27, 1998

[54] HOUSING FOR PRINTED CIRCUIT BOARD

[75] Inventors: Joachim Lehrmann, Lehrte; Wolfgang Gudat, Seelze, both of Germany

[73] Assignee: WABCO Vermogensverwaltungs GmgH, Hanover, Germany

[21] Appl. No.: 494,355

[22] Filed: Jun. 23, 1995

[30] Foreign Application Priority Data

Jun. 24, 1994 [DE] Germany ............... 44 22 113.4

[51] Int. Cl.[6] .................................. H05K 7/20
[52] U.S. Cl. .................. 361/704; 257/719; 361/710; 361/719
[58] Field of Search ............... 165/80.3, 185; 174/16.3; 257/712, 713, 718, 719, 722, 727; 361/736, 752, 725, 727, 785, 796, 801–803, 703, 704, 707, 709, 710, 728, 717–719

[56] References Cited

U.S. PATENT DOCUMENTS

| 4,196,467 | 4/1980 | Jakob et al. | 361/399 |
|---|---|---|---|
| 4,441,140 | 4/1984 | Richard | 361/386 |
| 4,546,407 | 10/1985 | Benenati | 361/386 |
| 4,557,225 | 12/1985 | Sagues | 123/41.31 |
| 4,707,726 | 11/1987 | Tinder | 361/710 |
| 4,899,255 | 2/1990 | Case | 361/386 |
| 5,077,638 | 12/1991 | Andersson | 361/388 |
| 5,343,361 | 8/1994 | Rudy, Jr. | 361/710 |
| 5,388,995 | 2/1995 | Rudy, Jr. | 439/61 |
| 5,426,567 | 6/1995 | Opeka | 361/740 |
| 5,461,542 | 10/1995 | Kosak et al. | 361/710 |

FOREIGN PATENT DOCUMENTS

| 30 41 546 C 2 | 11/1983 | Germany. |
|---|---|---|
| 33 10 477 A 1 | 1/1984 | Germany. |
| 83 18 781 U1 | 7/1984 | Germany. |
| 25 46 334 C 2 | 10/1984 | Germany. |
| 35 04 712 A 1 | 8/1985 | Germany. |
| 88 14 387 U1 | 3/1989 | Germany. |
| 38 35 178 A1 | 4/1990 | Germany. |
| 38 41 893 A 1 | 6/1990 | Germany. |
| 39 27 755 A1 | 2/1991 | Germany. |
| 40 37 603 A 1 | 5/1991 | Germany. |
| 91 11 118 U1 | 11/1991 | Germany. |
| 40 35 526 A 1 | 5/1992 | Germany. |
| 41 06 453 C 1 | 8/1992 | Germany. |
| 42 12 369 A1 | 10/1993 | Germany. |

OTHER PUBLICATIONS

WABCO Brochure, "ABS/ASR für Nutzkrafwagen C–Generation" (Apr. 1992) (4 pages).

Primary Examiner—Gerald P. Tolin
Attorney, Agent, or Firm—Meltzer, Lippe, Goldstein et al.

[57] ABSTRACT

An electronics module, such as those used in vehicles, comprises a cuboid housing box which is open on one side, a cover with connection plugs to cover the open side of the housing box, and at least one printed circuit board within the housing box and attached to the printed circuit board. Power components producing relatively significant heat are installed on the printed circuit board and in contact with cooling flanges integral with the cover. To facilitate soldering, the cover does not extend along the soldering side of the printed circuit board.

3 Claims, 2 Drawing Sheets

HOUSING FOR PRINTED CIRCUIT BOARD

BACKGROUND OF THE INVENTION

This invention relates to an electronics module, and more particularly, to an electronics module for automotive applications.

A prior art electronics module of this type is the electronics module for the ABS/ASR-C electronic system of the company WABCO Westinghouse Fahrzeugbremsen. The problem with this prior art device is that several process steps are required to produce it. In the first process step, a printed circuit board is equipped with components and a cooling element. This is followed by the second process step, in which the assembled printed circuit board is soldered in a solder bath. In the third process step, a cover is attached to the printed circuit board and a heat-conducting connection between the cooling element and the cover is established.

It is therefore the object of the present invention to develop an electronics module that is simpler and less expensive to manufacture.

SUMMARY OF THE INVENTION

This object is achieved by means of an electronics module comprising a hollow cuboid housing box which is open on one side, a cover for the open side of the housing box, and a printed circuit board within the housing box which is attached to the cover. Heat producing components on the printed circuit board are in contact with cooling flanges attached to the cover. The cover does not extend along the side of the printed circuit board on which soldering takes place.

One advantage of the present invention is that the cover can be attached together with other components to the printed circuit board before the soldering step. This makes it possible to omit a separate assembly step for the attachment of the cover to the printed circuit board which in the past followed the solder bath.

Another advantageous feature of the present invention is that the cooling flange and the cover are formed into one piece for a printed circuit board in which at least one of the components is a heat-producing power component and which requires a cooling element for cooling the power component. This feature of the present invention has the advantage that heat transfer between the heat-producing power component, the cooling element, and the heat-transferring cover is considerably improved. When the cooling element and the cover are made as separate components, small unavoidable air gaps are formed when the cooling element is attached to the cover. The air gaps act as significant resistances to heat transfer and impair considerably the heat elimination between the cooling frame and the cover.

In another feature of the present invention, the cover is provided with receptacles to receive at least one connection plug, whereby the connection plug is connectable on the outside of the cover and is connected to the strip conductors of the printed circuit board. The advantage of this feature of the present invention is that the cover already holds the connection plug in its final position during the soldering step without any additional means.

In another feature of the present invention, the cover, the printed circuit board, and the connection plug contained in the cover are connected to each other by means of at least one connecting element passing through all of these parts. This feature of the present invention has the advantage that room for more components for additional circuitry becomes available with a board of the same size thanks to the space-saving assembly on the lateral surface of the printed circuit board. If the circuitry requirements remain unchanged, the size of the printed circuit board may be reduced.

The present invention as well as the described features of the present invention can be used to special advantage in motor vehicles. This is due to the fact that space for electronics modules is limited in motor vehicles and that comparatively significant heat loads from the power components must be carried off under these cramped conditions.

The invention is explained in further detail through the example of an embodiment and with the help of the drawings.

BRIEF DESCRIPTION OF THE DRAWINGS

In FIGS. 1, 2 and 3 the same reference numbers are used for identical parts.

DESCRIPTION OF THE PREFERRED EMBODIMENT

Figure 1:
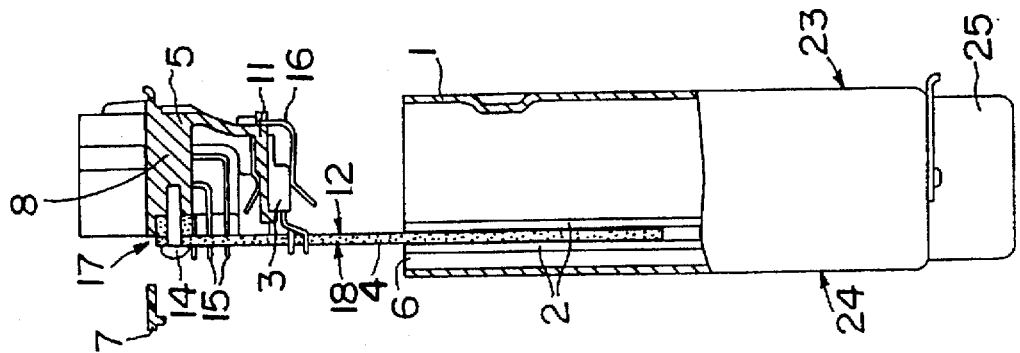
FIG. 1 shows an electronics module according to the present invention in a lateral view and partially in section.

An electronics module according to the invention is shown in FIG. 1 in a side view and comprises a housing box (1), with interior thrust guides and holding elements (2), a printed circuit board (4) provided with a relatively significant heat-producing power component (3), and a cover (5).

Figure 3:
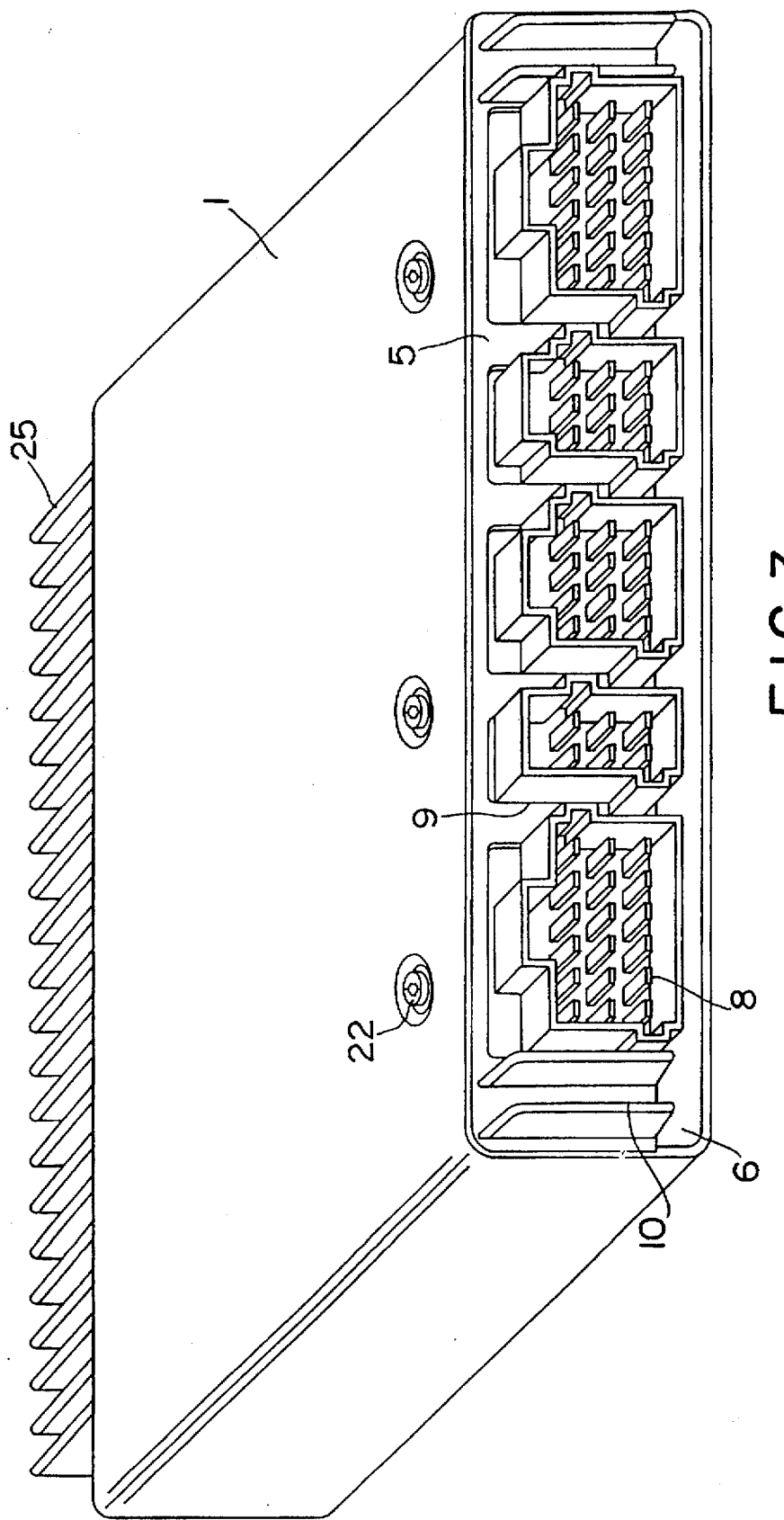
FIG. 3 shows a perspective view of the electronics module according to FIG. 1.

The housing box (1) is a cuboid hollow body made of a heat-conducting material, in particular metal, that is open on one side. As best seen in FIG. 3, the cover (5) is a cooling body with receptacles (9) open on one side in the direction of the printed circuit board (4) into which the connection plugs (8) can be fitted. The connection plugs (8) can be attached to the cover (5).

Figure 2:
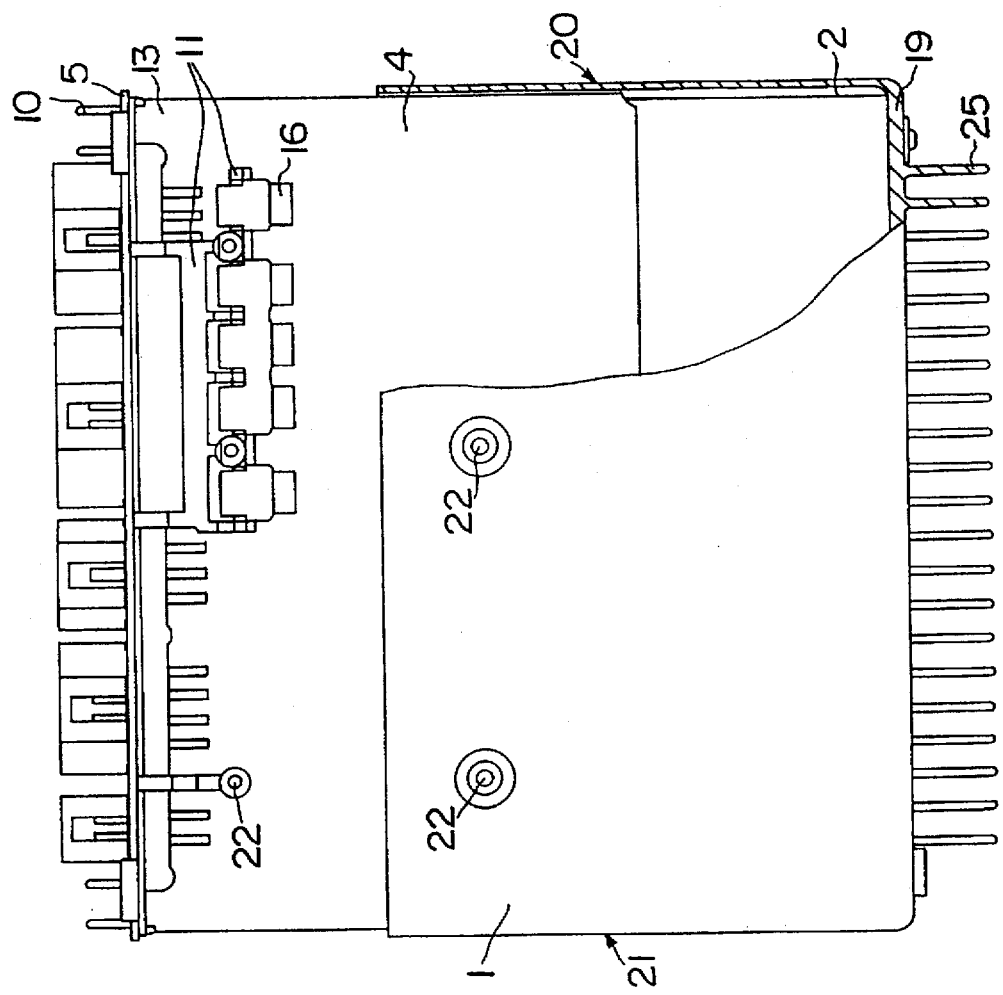
FIG. 2 shows the electronics module of FIG. 1 in a top view and partially in section.

The cover (5) is provided with cooling flanges (10) and (11) as shown in FIG. 2 formed on the outside and inside of the cover (5) which is made of heat-conducting materials. The cover (5) with the fitted connection plugs (8) is attached to a lateral surface (12) of the printed circuit board (4) which supports components at a border section (13) as shown in FIG. 2 on the cover side. The attachment may be done in such a way that the cover (5), the fitted connection plugs (8), and the printed circuit board (4) having power components (3) are connected to each other by means of one or several screws (14), with one screw penetrating all of the mentioned parts. This means that the cover (5), the connection plugs (8) and the printed circuit (4) are connected throughout with the same screws (14). The cover (5) has a projection extending parallel with the printed circuit board (4) which is traversed by the screw (14). This screw connection of the mentioned parts into one unit (3, 4, 5, 8, 14) provides advantages for assembly of the module.

Instead of screws for the connection of the cover (5), the connection plugs (8) and the printed circuit (4), it is also possible to use other connecting elements which traverse the mentioned parts. Pins which can be pressed in, such as grooved pins, or pin-like spring elements, such as clamping sleeves, or coiled clamping sleeves are examples. If pin-like connecting elements are used, the cover (5), the connection plugs (8) and the printed circuit board (4), upon their complete assembly, can be combined into one unit (3, 4, 5, 8, 14) and the unit can be passed through the soldering bath. Thanks to this soldering process, all the electronic components and the solderable pin-like connecting element can be connected permanently by soldering to the solderable lateral surface (18) of the printed circuit board (4). A special variant of pin-like connecting elements may consist of a pin in the form of a peg formed into one piece with the cover (5) on the side toward the printed circuit board (4). This peg-pin is then used to connect the cover, the connection plugs (8) and the printed circuit board (4) to form one unit (3, 4, 5, 8, 14) which, as described above, can then be connected in the soldering bath by soldering to the printed circuit board (4). In the embodiment shown in the drawings, the connection plugs (8) can be connected on the outside of the cover, and on the inside of the cover they are connected via contact connections (15) to the circuit lines of printed circuit board (4).

The power component (3) is in contact with cooling flanges (11) which are incorporated on the inside of the cover (5). Intimate contact between the contact surfaces of cooling flanges (11) and of power components (3) can be further improved by the clamping force of a clamp (16) which surrounds the two elements (3) and (11), thus promoting heat transfer from the power components (3).

The design of the cover (5) with cooling flanges (10) and (11), integrated into one piece on the outside and inside of the cover, causes a removal of heat accumulation from the vicinity of the power component (3) and improves heat transfer in the area of the electronics module which is parallel to the printed circuit board.

Thanks to the contacting arrangement of the power component (3) against the cooling elements (11), space is saved on the circuit board and the remaining surface of the printed circuit board (4) is free for installation of other components. The advantages of this space savings are the same as those already described for the attachment by means of the screw (14) which traverses all the parts.

All those components producing excess heat when current passes through them are represented by the relatively significant heat-producing power component (3). These components may cause heat accumulation due to the high packing density of the components on the printed circuit board (4) and, as a consequence, may even lead to malfunctions or destruction of these components or other components in the immediate vicinity. Such components are most often transistors, but also resistors and voltage regulators as well as other components that may produce excess heat when current passes through them. Microprocessors which cannot be cooled through direct contact also produce excess heat and contribute to the heat accumulation.

The cover (5) is attached to the printed circuit board (4) along the lateral surface (12) at a forward edge (17) of the new border section (13) of the printed circuit board (4). There is no overhang of the cover (5) along the opposite lateral surface (18) of the printed circuit board (4) on which soldering takes place. As a result of this design, it is possible to take the entire unit (3, 4, 5, 8, 14) advantageously through a wave soldering bath. Before this is done, the power components have already been fixed in their final positions on the printed circuit board. An additional auxiliary holding means to attach the power components for this soldering process can be advantageously omitted. The assembly steps required for the auxiliary holding means are also omitted. Furthermore, it is possible to fix the power components mechanically free from tension. The clamp (16) improves the attachment by causing the power components (3) to lie flat and without air gap against the cooling element (11) on the inside of the cover.

The housing box (1) contains thrust guiding and holding elements (2), e.g., in the form of guide grooves, on its inner walls, on the narrow sides (20) and (21) shown in FIG. 2. In addition, a stop is provided between at least one of the two wide side walls (23, 24) of the housing box (1) and the cover (5) by means of the screw connection (22) shown in FIG. 3, the flat adherence of which makes it possible to achieve additional contact and improved removal of accumulated heat starting from the integrated cooling flanges (11) on the inside of the cover via the housing box (1) and into the environment.

Due to the design of the cover (5) without an overhang, an opening (6) remains between the soldering lateral surface (18) of the printed circuit (4) and the wide-surfaced lateral wall (23) which can either remain open or be covered by a simple auxiliary cover (7). This additional auxiliary cover need not be made of a heat-conducting material and need not carry out any additional functions, such as holding in place (fixing, etc.). The auxiliary cover (7) may be a simple screen and may be placed over the opening (6) after the assembly of the unit (3, 4, 5, 8, 14) together with the housing box (1).

The installation of additional components on the printed circuit board (4) in order to implement the indicated electronics plan could result in excessive packing density. This could lead to heat accumulation problems which make it necessary to include additional cooling capacity for the electronics module.

According to FIG. 2, additional cooling flanges (25) are available when additional cooling capacity is required, and these flanges can be integral with the housing box (1) on the outside of the bottom wall (19) of said housing box (1). The cooling flanges (25) made from cooling ribs, assist advantageously in the removal of heat accumulated in the housing box, especially when several electronics modules are arranged in the vehicle tightly packed against each other, and when no convection is possible between them or against their broad-surface lateral walls.

On the other hand, there are also applications where the heat conduction over the cover (5) is sufficient. In these cases the housing box (1) may be made of a simple, non-heat-conducting material (e.g., plastic) and need not be provided with any cooling flanges (25).

The cover (5) can be produced in a known manner in a pressure casting system as a pressure-cast part.

While the invention has been described by reference to a specific embodiment, this was for purposes of illustration only. Numerous alternative embodiments will be apparent to those skilled in the art and are considered to be within the scope of the invention.

List of Parts 1 housing box
2 thrust guiding and holding element
3 power component
4 printed circuit board
5 cover
6 opening
7 auxiliary cover
8 connection plug
9 receptacle
10 cooling element, outside the cover 11 cooling element, inside the cover
12 lateral surface with installed components
13 border section on the cover side
14 screw
15 contact connection
16 clamp
17 forward edge
18 lateral surface capable of being soldered in soldering bath
19 bottom wall
20 narrow lateral wall
21 narrow lateral wall
22 screw connection
23 wide lateral wall
24 wide lateral wall
25 cooling element on the outside of bottom wall

We claim:

1. A housing for a printed circuit board comprising:

a housing box in the form of a cuboid hollow open on one side;

a cover which covers said open side of said housing box;

a printed circuit board on which components are installed within said housing box, said printed circuit board having first and second lateral sides, said first lateral side being a soldering side and said second lateral side having said components installed thereon, said printed circuit board having a border section, said printed circuit board being connected to said cover on said lateral side at said border section;

wherein said cover extends along said lateral side having said components installed thereon and does not extend along said soldering side of said circuit board;

wherein said cover includes at least one receptacle which contains at least one connection plug passing through said cover to connect with at least one strip conductor on said printed circuit board.

2. A housing for a printed circuit as in claim 1, further comprising at least one cooling flange which is integral with said cover, at least one of said components on said printed circuit board being a heat-producing power component which is in contact with said cooling flange to cool said power component.

3. A housing for a printed circuit board as in claim 1, wherein said cover, said printed circuit board, and said connection plug are connected to each other by at least one connecting element traversing said cover, said printed circuit board, and said connection plug.

* * * * *